United States Patent [19]
Stumbo et al.

[11] Patent Number: 5,160,845
[45] Date of Patent: Nov. 3, 1992

[54] ALIGNMENT TECHNIQUE FOR MASKED ION BEAM LITHOGRAPHY

[76] Inventors: David P. Stumbo, 1654 Harold St., Houston, Tex. 77006; John C. Wolfe, 5343 Queens Loch, Houston, Tex. 77096; John N. Randall, 2906 Ambleside, Richardson, Tex. 75082

[21] Appl. No.: 665,616

[22] Filed: Mar. 6, 1991

[51] Int. Cl.$^5$ .......................................... H01V 37/304
[52] U.S. Cl. ............................... 250/491.1; 250/492.2; 250/398; 250/397; 378/34
[58] Field of Search ............. 250/491.1, 492.21, 492.2, 250/398, 397, 492.3; 378/34

[56] References Cited

PUBLICATIONS

Feder et al., Polymer Engineering and Science, Jun., 1977, vol. 17, No. 6, pp. 385-389.
Feder et al., IBM Technical Disclosure Bulletin, vol. 16, No. 4, Sep. 1973, p. 1306.

Primary Examiner—Jack I. Berman
Attorney, Agent, or Firm—Richter Darryl Burke; Richard L. Donaldson

[57] ABSTRACT

The ion beam which performs the printing on the resist through the mask is also used to perform the alignment function. Alignment marks are initially provided on the wafer of a material which emits light when an ion beam impinges thereon, such as silicon dioxide. An ion mask, preferably of silicon, is then positioned over the wafer and alignment marks and ions are directed to the alignment marks through the mask. The degree of alignment is determined by the amount of light emitted by the alignment marks since more ions will strike the alignment marks with increased alignment. The emitted light is detected and +X, −X, +Y, −Y and +theta and −theta error signals are provided on a continuous basis for closed loop control of the mask relative to the wafer under proper alignment is achieved. The control is provided by scanning the emitted light from six appropriately positioned alignment marks on the wafer, comparing the intensity of the emitted light in terms of +X amd −X signals to provide an X error signal, doing the same with the Y and theta signals to provide Y and theta error signals and then digitizing each of the error signals in a digital to analog converter. The digitized signals are then applied to a central processing unit wherein they are analyzed in accordance with a predetermined program and provide signals to a motor controller. The motor controller proceeds to provide output signals to properly position the wafer in the X and Y directions as well as to rotate the mask to provide the desired alignment between the mask and wafer.

39 Claims, 4 Drawing Sheets

ALIGNMENT TECHNIQUE FOR MASKED ION BEAM LITHOGRAPHY

BACKGROUND OF THE INVENTION

1. FIELD OF THE INVENTION

This invention relates to ion beam lithography and, more specifically, to a technique for alignment of a mask and wafer for ion beam lithography.

2. BRIEF DESCRIPTION OF THE PRIOR ART

In order to fabricate integrated circuits with increased component density, it is desirable that lithographic lines be formed which are as narrow as possible. Until recently, about a one micron photolithographic line was the minimum width available. Recently, using optical techniques, photolithographic lines having widths as thin as 0.3 microns have been reported. However, it is desirable to obtain lithographic lines of even smaller dimension in the sub 0.1 micron range.

Masked ion beam lithography is a technique by which extremely small features can be patterned. Masked ion beam lithography has the advantage of higher resolution and of speed and economics as compared with x-ray lithography.

In masked ion beam lithography, a mask consisting of transmissive and opaque regions corresponding to an integrated circuit pattern is illuminated by a flood beam of 50 to 200 keV ions. The ions passing through the mask deposit their energy in the resist in a very efficient and spatially confined manner. The deposited energy creates a latent image of the mask pattern in the resist which can be developed. There is little lateral scattering or longitudinal straggle since ions interact primarily with the lighter resist electrons. Consequently, the latent image in exposed resist is sharply defined, both laterally and vertically. The resolution limit is determined by the range of secondary electrons (less than 10 nm) and the contrast of the mask. This intrinsically high contrast leads to wide exposure latitude and a relaxation of resist requirements. Ions expose resist very efficiently. Critical doses are typically one order of magnitude smaller than for electrons and two orders of magnitude smaller than for x-rays. Features smaller than 30 nm have already been printed using the technique of the subject invention. Ion sources of high brightness are commercially available at reasonable prices.

Masked ion beam lithography has been implemented both in 1:1 proximity printing and demagnifying ion projection lithography, where a stencil mask is illuminated by low energy ions (5 keV) which are accelerated and demagnified by an electrostatic optical system. X-ray lithography, also a proximity printing process, is less efficient, more costly and has poorer resolution than ion beam lithography.

A remaining problem in ion beam lithography has been the inability to align multiple layers with each other with an accuracy comparable to the obtainable resolution. The prior art has used principally optical techniques to align x-ray masks or ion beam masks to wafers. Typically, a diffraction grating has been placed upon the mask and the wafer and a light beam, such as from a laser, has been directed to the gratings with optical techniques then being used to align the marks on the wafer with the marks on the mask. Such techniques are complex and still do not provide the degree of alignment accuracy now required. These techniques are also not suitable for ion projection lithography, where the mask and wafer are too far apart to make them practical. In ion projection lithography, detection of the secondary electrons emitted from grooves in the wafer when the ion "image" of slots in the mask impinge on them has been used for alignment. The disadvantage of this technique is that the secondary electrons have a very short range in resist, so essentially all resist must be removed from the grooves on the wafer before alignment can be performed. The technique in accordance with the present invention can tolerate much thicker resist coatings on the wafer.

It is also known that when an ion strikes silicon dioxide, the silicon dioxide emits deep blue light. It has been experimentally determined that the yield is greater than 0.5 photons per proton at 100 keV ion energy. Other materials, such a silicon or polymethylmethacrylate (PMMA), a typical proton resist, do not emit observable amounts of light. This has suggested an alignment system based upon the detection of this light in accordance with the present invention.

SUMMARY OF THE INVENTION

In accordance with the present invention, there is provided a system to accurately align a wafer and mask for use in ion beam lithography which provides results better than those obtained by the prior art techniques.

Briefly, in accordance with the present invention, the ion beam which performs the printing on the resist through the mask is also used to perform the alignment function. Alignment marks of a material which emits light when an ion beam impinges thereon are provided on the wafer. A corresponding set of marks is etched through the mask, which must be made of a material, such as silicon dioxide, which does not emit light. The ion mask is then positioned over the wafer and ions are directed to the alignment marks through the corresponding transmission windows in the mask. The degree of alignment is determined by the amount of light emitted by the alignment marks since more ions will strike the alignment marks with better alignment. The emitted light is detected and X, Y and theta signals are provided on a continuous basis for control of the electro-mecchanical actuators which position the mask and wafer so that proper alignment is achieved. It is also possible to position the ion "shadow" of the mask on the wafer by electrostatically deflecting the ion beam. The technique of the subject invention enables use thereof instead of or in conjunction with mechanical motion for fine alignment. Optical interference techniques cannot do this.

DESCRIPTION OF THE PREFERRED EMBODIMENT

Figure 1:
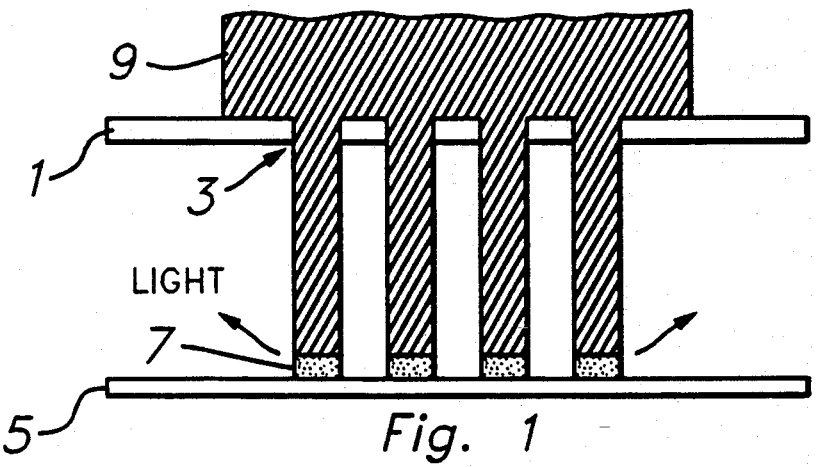
FIG. 1 is a schematic diagram of a mask and wafer in aligned condition in accordance with the present invention.

Referring to FIG. 1, there is shown a silicon ion beam mask 1 which is opaque to ions and has apertures 3 therein which are transparent to ions, the mask being spaced from a wafer 5 having silicon dioxide alignment mark regions 7 thereon which are 200 by 200 microns in size. A light ion beam 9 whose energy is chosen so that the ion range in the resist is about the same as the resist thickness impinges upon the mask 1 with ions impinging upon the mask at the apertures 3 passing through the mask to the wafer 5. If apertures 3 and the regions 7 overlap, ions 9 passing through the apertures 3 will strike the regions 7 and light will be emitted by the silicon dioxide regions. The intensity of the light emitted by the region 7 will depend upon the degree of alignment between the apertures 3 and the regions 7. As can be seen in FIG. 1, there is complete alignment. Therefore many ions 9 impinge on the regions 7 and a large amount of light is emitted by the regions 7.

Figure 2:
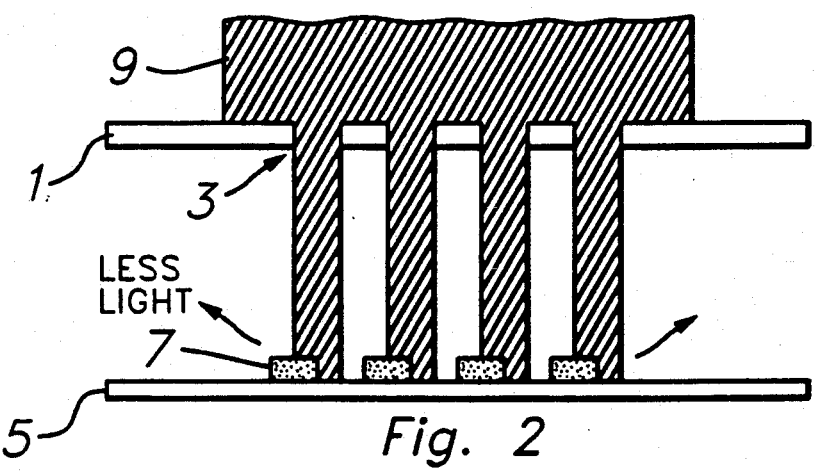
FIG. 2 is a schematic diagram of a mask and wafer in partially aligned condition in accordance with the present invention.

In FIG. 2, the wafer 5 and regions 7 thereon have been moved relative to the mask 1 so that some of the ions 9 strike the region 7 and others do not, thereby providing for emission of less light than in the case shown in FIG. 1.

Figure 3:
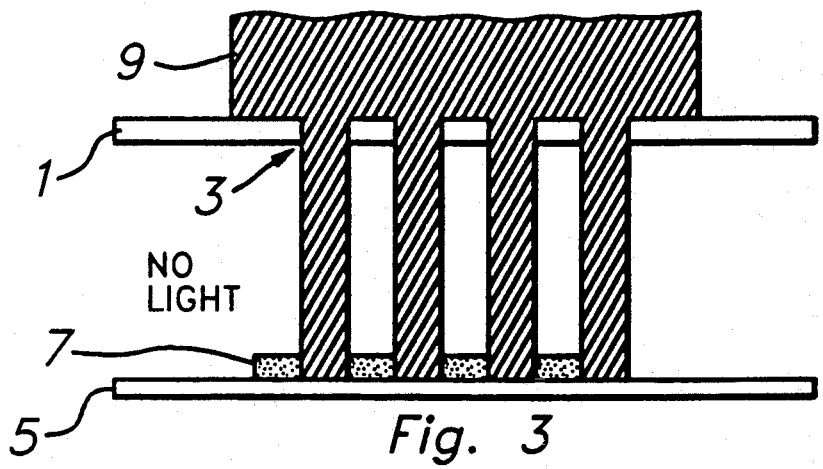
FIG. 3 is a schematic diagram of a mask and wafer in unaligned condition in accordance with the present invention.

In FIG. 3, the movement of the wafer 5 relative to the mask 1 is such that no ions in the ion beam 9 passing through the apertures 3 strike the regions 7, thereby providing for no light emission. It can therefore be seen that as the wafer 5 is moved relative to the mask 1 from the position of FIG. 1 to the position of FIG. 3, the amount of light emitted will gradually decrease until no light is emitted when there in no registration as shown in FIG. 3.

By use of regions 7 as alignment marks, it is possible to properly position the mask 1 relative to the wafer 5 by means extracting the X, Y and Theta error signals on a continuous basis as will be described hereinbelow. It is preferable that the ions impinge upon the wafer only in the areas of the alignment marks 7 during alignment so as not to expose the resist. Accordingly, other portions of the wafer are shielded from the ion beam 9 with a shutter (not shown) during this period.

It can be seen no additional optical system need be adjusted to match the alignment of the ion beam since the ion beam used for patterning is also used to provide the alignment. Also, the material utilized for the wafer marks, namely silicon dioxide, is very common and easily applied to the wafer by well known integrated circuit technology. It is, of course, necessary to avoid having silicon dioxide which is being used in the fabrication of the integrated circuit located at the location of the alignment marks 7.

Figure 4:
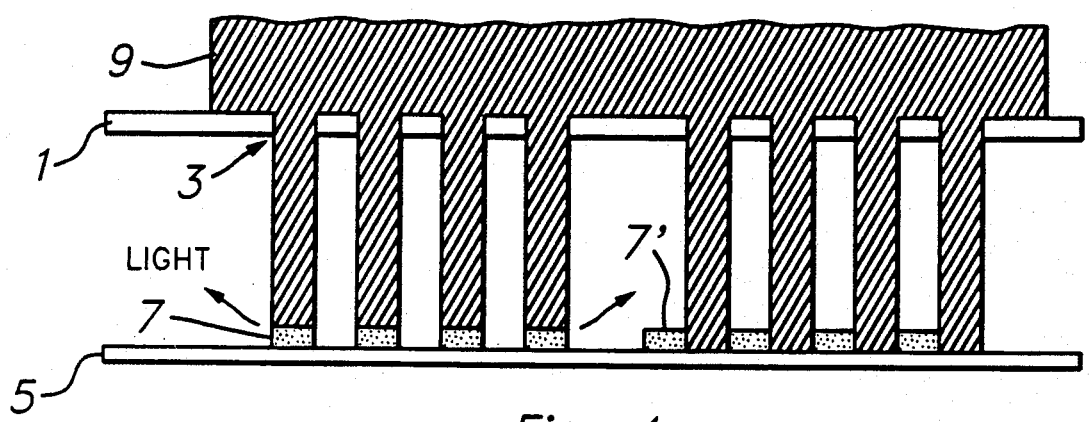
FIG. 4 is a schematic diagram in accordance with a second embodiment of the invention.

A further embodiment is shown in FIG. 4 wherein two sets of alignment marks are provided. In this embodiment, the alignment marks 7 are as described above. However the alignment marks 7' are offset so that when the alignment marks 7 are in full alignment and provide a maximum light signal, the alignment marks 7' are fully out of alignment and provide a minimum light signal. The two signals received from the alignment marks 7 and 7' are then subtracted to generate an error signal. This scheme has the advantage that any gain errors or direct current offsets do not cause position errors and that, over a range of one period (1 micrometer) centered on the desired position, there are no sign changes in the slope. The final modification to make the marks more practical is to make their patterns random. When this is done with a large number of apertures for each mark, there is only one maximum and it is therefore much easier to locate.

Figure 5:
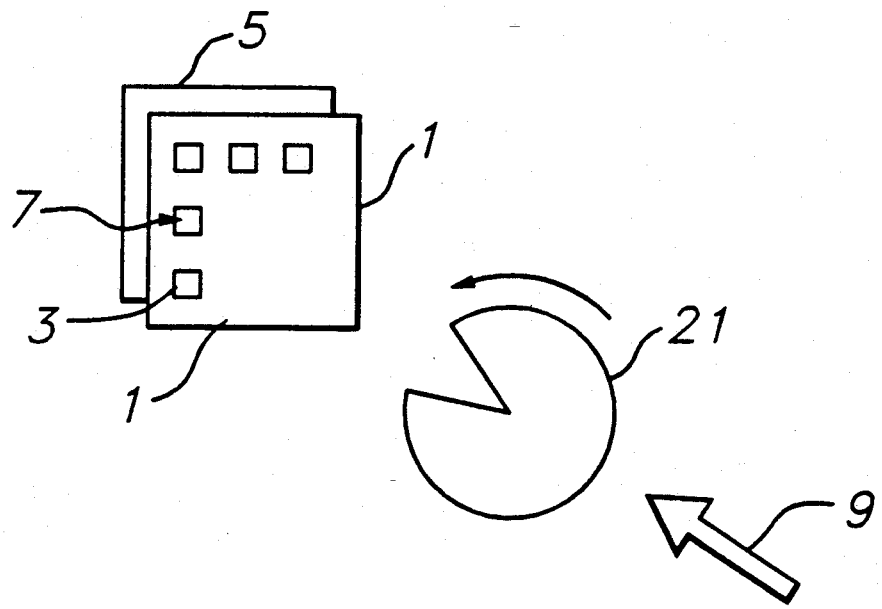
FIG. 5 is a diagram that illustrates the use of shutter to illuminate one mark at a time.

In order to generate the error signals, all or part of the light emitted from six marks, two X for the X-axis, two Y for the Y-axis and two Y' for rotation, must be collected and turned into separate signals. This can be accomplished by time division multiplexing. In this embodiment, a rotating shutter 21 is placed between the ion source 9 and the mask 1 and wafer 5 assembly. By choosing the width of the open area on the shutter and the spacing of the marks appropriately, the ion beam can be made to fall on only one mark 7 at a time as shown in FIG. 5.

Figure 6:
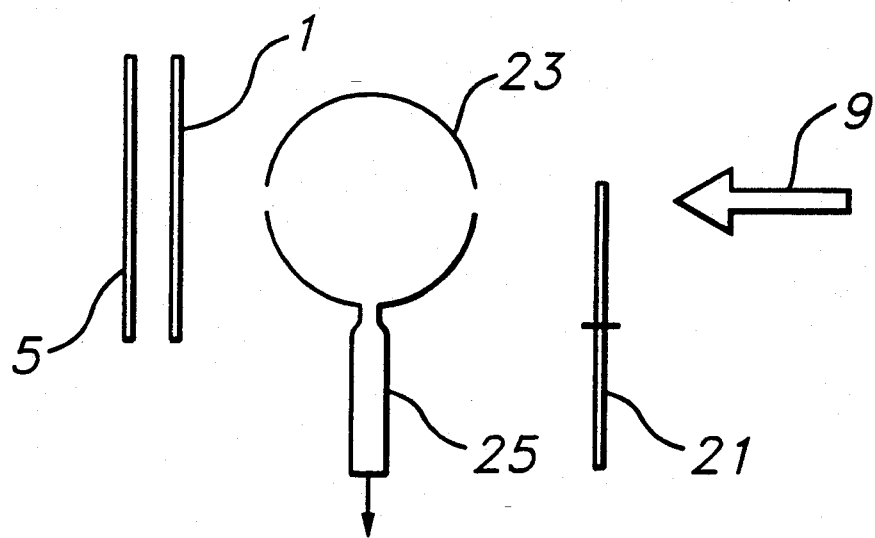
FIG. 6 is a diagram of a second embodiment of a system for reading the output of the systems of FIGS. 1 to 4.

As shown in FIG. 6, the light can be collected with an integrating sphere 23 and photomultiplier tube 25 and the electrical output consisting of signals from each mark in succession is time division demultiplexed in synchronism with the shutter rotation. This provides six continuous separate signals, each proportional to the degree of alignment of its respective mark.

Figure 7:
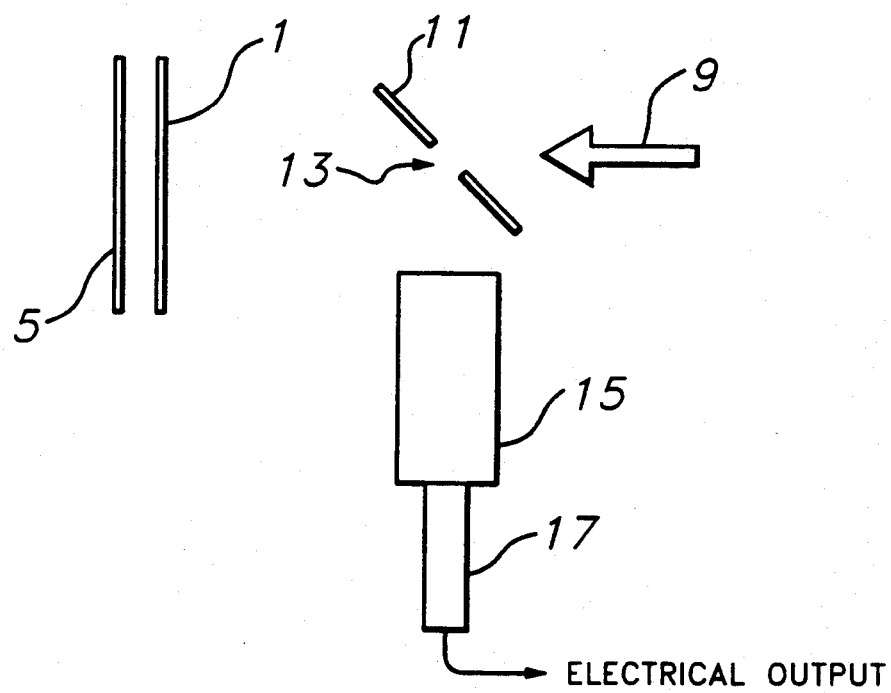
FIG. 7 is a diagram of a third embodiment of a system for reading the output of the systems of FIGURES 1 to 4.

Another light collection system is shown in FIG. 7 wherein collection of the light emitted by the silicon dioxide alignment marks 7 is shown. Such collection is accomplished by a mirror 11 having an aperture 13 through which the ion beam 9 passes on its travel through the mask 1 to the regions 7 on the wafer 5. The light reflected from the regions 7 is reflected back off the mirror 11 and onto a large working distance 15 and then imaged to form spatially separate images of each mark. These can be separated by using six photomultiplier tubes, or a scanning mirror and one photomultiplier tube 17, the output of which is then time division demultiplexed as above. The six signals received undergo the above mentioned subtractions and the resulting three error signals, after low pass filtering, are directed to a suitable servo system. Since the microscope is directed at the mask and wafer, it can also be used to provide an image of them if it is fitted with an illumination system and TV camera or eyepiece. This cannot be used simultaneously with the alignment system described above, but is useful for coarse alignment.

Figure 8:
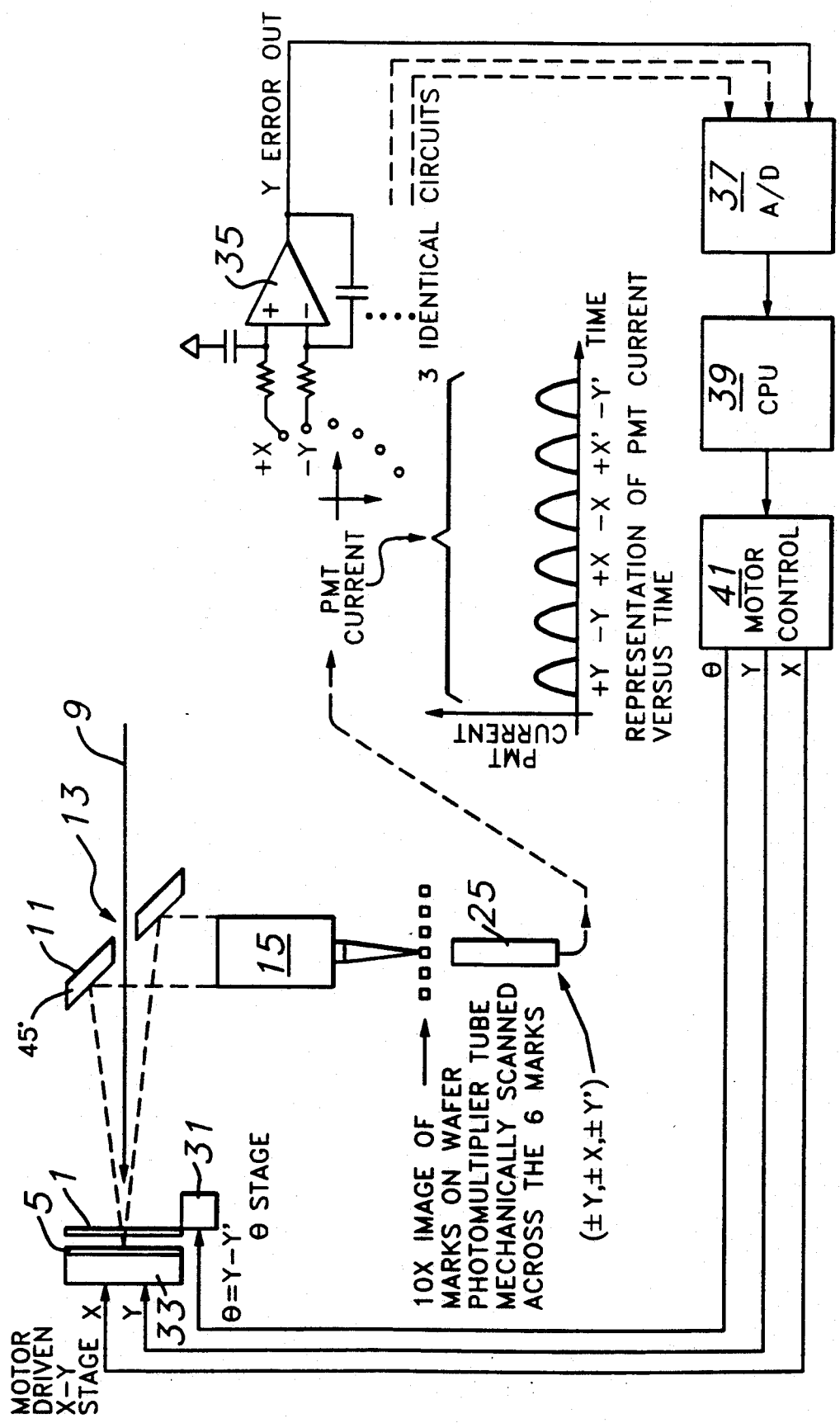
FIG. 8 is a schematic diagram of a complete system for reading the output of the systems of FIGS. 1 to 4 and correcting the alignment between the wafer and the mask.

Referring now to FIG. 8, there is shown a complete system for aligning a wafer in accordance with the present invention. There is shown a mask 1 which is rotationally adjustable by the theta stage element 31 in standard manner. The wafer 5 is secured to an x-y stage 33 and is movable in a x-y direction by movement of the stage 33 in standard manner. An ion beam 9 is directed through an aperture 13 at the center of a rotating mirror 11, the mirror being disposed at a 45 degree angle relative to the mask 1 and wafer 5. When ions from the ion beam 9 pass through the aperture 13 and mask 1 and strike silicon dioxide alignment regions 7 (not shown in FIG. 8) on the wafer 5, light is emitted from the regions 7 to the mirror 11 and collects the light reflected from the mirror and enlarges the image received from the wafer by a factor of ten. This image is scanned across the photomultiplier tube 25 by a rotating mirror (not shown) so that the portions of the image corresponding to the six marks each dwell on the photomultiplier tube 25 for a period of time. These optical images are detected by the photomultiplier tube 25 and then time division demultiplexed which provides six output signals corresponding to a +Y, −Y, +X, −X, +Y′ and −Y′ signal. The +Y and −Y signals for Y alignment are sent to a Y alignment circuit composed of a two input difference amplifier 35 which provides a Y error output. This output is converted to a digital signal by an analog-to-digital (D/A) converter 37 which is sent to a central processing unit (CPU) 41. The CPU is programmed to read the digitized Y error signal and provide an error signal to a motor controller 41 along the Y output thereof to control the Y position of the motor driven x-y stage 33. Similarly, two additional circuits identical to circuit 35 are provided, one to receive the +X and −X signals and provide an X error output and one to receive the +Y′ and −Y′ signals and provide a theta error output. The X error output and theta error output are applied to the A/D converter 37, CPU 39 and motor controller 41 in the same manner as discussed above with respect to the Y error output to provide a theta output and an X output from the motor controller 41 (theta being Y-Y′). The X output controls the X position of the motor driven x-y stage 33 and the theta output controls the theta stage 31 in standard manner.

It should be understood that the stage 33 and theta stage 31 can be continually operated until a maximum is achieved for each dimension to provide optimum alignment. The stage 33 can be replaced by electrostatic X and Y deflection of the ion beam. Alternatively, the error signal can be compared in the CPU with a standard set of values stored in a data base therein with optimum alignment being determined when the error signal for each dimension is in a range stored in the CPU.

It can be seen that the alignment of the wafer and mask is provided using simple and already available equipment, such alignment being provided with a very small error.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of aligning first and second elements with respect to each other comprising the steps of:
   (a) providing said first and second elements which are movable with respect to each other;
   (b) providing said first element with alignment marks responsive to radiations impinging thereon to emit electromagnetic radiations;
   (c) providing said second element with regions extending therethrough transparent to said radiations;
   (d) passing said radiations through said transparent regions to said first element to cause said alignment marks upon which said radiations impinge to emit said electromagnetic radiations
   (e) collecting said electromagnetic radiations and transforming said electromagnetic radiations into a signal; and
   (f) using said signal to align said first and second elements geometrically with respect to each other.

2. The method of claim 1 wherein said first element is a semiconductor wafer and said second element is a mask.

3. The method of claim 1 wherein each of said regions transparent to said radiations and each of said alignment marks are simultaneously alignable with each other.

4. The method of claim 2 wherein each of said regions transparent to said radiations and each of said alignment marks are simultaneously alienable with each other.

5. The method of claim 1 wherein said regions transparent to said radiations and said alignment marks are simultaneously alignable with each other while other radiations and other alignment marks are simultaneously not alignable with each other.

6. The method of claim 2 wherein said regions transparent to said radiations and said alignment marks are simultaneously alignable with each other while other regions transparent to said radiations and other alignment marks are simultaneously not alignable with each other.

7. A system for aligning first and second elements with respect to each other comprising:
   (a) first and second elements which are movable with respect to each other;
   (b) said first element having disposed thereon alignment marks responsive to radiations impinging thereon to emit electromagnetic radiations;
   (c) said second element having regions extending therethrough transparent to said radiations;
   (d) means for passing said radiations through said transparent regions to said first element to cause said alignment marks upon which said radiations impinge to emit said electromagnetic radiations;
   (e) means for collecting said electromagnetic radiations and transforming said electromagnetic radiations into a signal; and
   (f) means responsive to said signal to align said first and second elements geometrically with respect to each other.

8. The system of claim 7 wherein said first element is a semiconductor wafer and said second element is a mask.

9. The system of claim 7 wherein each of said regions transparent to said radiations and each of said alignment marks are simultaneously alignable with each other.

10. The system of claim 8 wherein each of said regions transparent to said radiations and each of said alignment marks are simultaneously alignable with each other.

11. The system of claim 7 wherein said regions transparent to said radiations and said alignment marks are simultaneously alignable with each other while other said regions transparent to said said regions transparent to said radiations and other alignment marks are simultaneously not alignable with each other.

12. The system of claim 8 wherein said regions transparent to said radiations and said alignment marks are simultaneously alignable with each other while other said regions transparent to said radiations and other alignment marks are simultaneously not alignable with each other.

13. The system of claim 7 wherein said mask is formed of polymethylmethacrylate.

14. The system of claim 8 wherein said mask is formed of polymethylmethacrylate.

15. The system of claim 9 wherein said mask is formed of polymethylmethacrylate.

16. The system of claim 10 wherein said mask is formed of polymethylmethacrylate.

17. The system of claim 11 wherein said mask is formed of polymethylmethacrylate.

18. The system of claim 12 wherein said mask is formed of polymethylmethacrylate.

19. The system of claim 7 wherein said alignment marks are formed of silicon dioxide.

20. The system of claim 8 wherein said alignment marks are formed of silicon dioxide.

21. The system of claim 10 wherein said alignment marks are formed of silicon dioxide.

22. The system of claim 12 wherein said alignment marks are formed of silicon dioxide.

23. The system of claim 14 wherein said alignment marks are formed of silicon dioxide.

24. The system of claim 16 wherein said alignment marks are formed of silicon dioxide.

25. The system of claim 18 wherein said alignment marks are formed of silicon dioxide.

26. The system of claim 7 wherein said radiations are ions.

27. The system of claim 8 wherein said radiations are ions.

28. The system of claim 10 wherein said radiations are ions.

29. The system of claim 12 wherein said radiations are ions.

30. The system of claim 14 wherein said radiations are ions.

31. The system of claim 16 wherein said radiations are ions.

32. The system of claim 18 wherein said radiations are ions.

33. The system of claim 19 wherein said radiations are ions.

34. The system of claim 20 wherein said radiations are ions.

35. The system of claim 21 wherein said radiations are ions.

36. The system of claim 22 wherein said radiations are ions.

37. The system of claim 23 wherein said radiations are ions.

38. The system of claim 24 wherein said radiations are ions.

39. The system of claim 25 wherein said radiations are ions.

* * * * *